United States Patent
Kim

(10) Patent No.: US 11,391,781 B2
(45) Date of Patent: Jul. 19, 2022

(54) SOC ESTIMATING APPARATUS AND METHOD

(71) Applicant: LG CHEM, LTD., Seoul (KR)

(72) Inventor: Young-Jin Kim, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 10 days.

(21) Appl. No.: 17/269,392

(22) PCT Filed: Feb. 10, 2020

(86) PCT No.: PCT/KR2020/001843
§ 371 (c)(1),
(2) Date: Feb. 18, 2021

(87) PCT Pub. No.: WO2020/166914
PCT Pub. Date: Aug. 20, 2020

(65) Prior Publication Data
US 2021/0389381 A1 Dec. 16, 2021

(30) Foreign Application Priority Data
Feb. 15, 2019 (KR) .................. 10-2019-0018105

(51) Int. Cl.
*G01R 31/3842* (2019.01)
*G01R 31/392* (2019.01)
*H01M 10/48* (2006.01)

(52) U.S. Cl.
CPC ....... *G01R 31/3842* (2019.01); *G01R 31/392* (2019.01); *H01M 10/486* (2013.01)

(58) Field of Classification Search
None
See application file for complete search history.

(56) References Cited

U.S. PATENT DOCUMENTS

2007/0139013 A1 6/2007 Seo et al.
2007/0257681 A1* 11/2007 Christophersen .... G01R 31/367
324/426

(Continued)

FOREIGN PATENT DOCUMENTS

EP 3435102 A1 7/2017
EP 3435102 A1 1/2019

(Continued)

OTHER PUBLICATIONS

Extended European Search Report issued from the European Patent Office dated Oct. 26, 2021 in corresponding European Patent Application No. 20755254.8.

(Continued)

*Primary Examiner* — Jas A Sanghera
(74) *Attorney, Agent, or Firm* — Morgan, Lewis & Bockius LLP

(57) ABSTRACT

A SOC estimating apparatus according to an embodiment of the present disclosure includes: a measuring unit configured to measure at least one of voltage, current and temperature of a battery; a noise generating unit configured to generate noise corresponding to the voltage of the battery based on a plurality of preset voltage regions; a filtering unit configured to receive the noise generated by the noise generating unit and filter the generated noise to correspond to the voltage of the battery based on the plurality of preset voltage regions; and a SOC estimating unit configured to estimate a SOC of the battery based on at least one of voltage, current and temperature of the battery and the noise filtered by the filtering unit.

14 Claims, 4 Drawing Sheets

(56) References Cited

U.S. PATENT DOCUMENTS

| | | |
|---|---|---|
| 2014/0074416 A1 | 3/2014 | Park et al. |
| 2017/0199247 A1 | 7/2017 | Joe |
| 2019/0346511 A1 | 11/2019 | Lim et al. |
| 2020/0217897 A1 | 7/2020 | Walder |

FOREIGN PATENT DOCUMENTS

| | | |
|---|---|---|
| JP | 5028315 B2 | 9/2012 |
| JP | 2014-522488 A | 9/2014 |
| JP | 2015-105876 A | 6/2015 |
| JP | 2015-184219 A | 10/2015 |
| JP | 2018-096953 A | 6/2018 |
| JP | 2018-151176 A | 9/2018 |
| KR | 10-0669476 B1 | 1/2007 |
| KR | 10-2016-0048666 A | 5/2016 |
| KR | 10-1835377 B1 | 3/2018 |
| KR | 10-2018-0115124 A | 10/2018 |
| WO | 2018/190508 A1 | 10/2018 |

OTHER PUBLICATIONS

International Search Report (with partial translation) and Written Opinion issued in corresponding International Patent Application No. PCT/KR2020/001843, dated May 20, 2020.

* cited by examiner

SOC ESTIMATING APPARATUS AND METHOD

TECHNICAL FIELD

The present application claims priority to Korean Patent Application No. 10-2019-0018105 filed on Feb. 15, 2019 in the Republic of Korea, the disclosures of which are incorporated herein by reference.

The present disclosure relates to a SOC estimating apparatus and method capable of accurately estimating a SOC of a battery.

BACKGROUND ART

A battery is used as a power source in various fields since it may be repeatedly charged and discharged.

For example, the battery is used in a device that may be carried in a human hand, such as a mobile phone, a laptop computer, a digital camera, a video camera, a tablet computer, a power tool, and the like.

In addition, the battery is used in various electric-driven power devices, such as electric bicycles, electric motorcycles, electric vehicles, hybrid electric vehicles, electric ships, and electric airplanes.

In addition, the area where the battery is used is gradually expanding to a power storage device for storing power generated using a renewable energy or a surplus generated power and an uninterruptible power supply (UPS) for stably supplying power to various information communication devices such as a server computer and a base station for communication.

A state of charge (SOC) of the battery refers to a relative ratio of capacity currently remaining based on the capacity when the battery is fully charged, and may be expressed as a percentage or a number between 0 and 1.

Since the SOC represents the amount of energy remaining in the battery, the SOC is an essential parameter required when controlling charging and discharging of the battery. If the SOC is 100%, charging must be stopped, and if the SOC is 0%, discharging must be stopped. In addition, the SOC is also used when controlling the output of the battery or when estimating a state of health (SOH) of the battery.

The SOC may be estimated using an ampere-counting method. Here, the ampere-counting method determines the SOC by integrating a charging current and a discharge current over time. However, since there is a difference between a current measured by a current sensor and an actual current, the accuracy of the SOC estimated using only the ampere-counting method is degraded over time.

In addition to the ampere-counting method, there are algorithms using an equivalent circuit model (ECM) designed to simulate electrochemical properties of the battery, one of which is an extended Kalman filter. The extended Kalman filter is a probability statistical technique for estimating an internal state of a system using measurable parameters.

However, the accuracy of the extended Kalman filter decreases as the battery is degraded. For example, the equivalent circuit model of the extended Kalman filter includes parameters related to capacity and resistance of the battery, but it is difficult to properly update the parameters of the equivalent circuit model due to the capacity degradation and the resistance increase caused by degradation of the battery.

In addition, the equivalent circuit model of the extended Kalman filter is designed to simulate linear operational characteristics of the battery, and thus it is very difficult to design the equivalent circuit model to accurately simulate non-linear operational characteristics of the battery.

DISCLOSURE

Technical Problem

The present disclosure is designed to solve the problems of the related art, and therefore the present disclosure is directed to providing an apparatus and method, which may more accurately estimate a SOC of a battery by generating and filtering process noise based on a voltage of the battery.

Technical Solution

In one aspect of the present disclosure, there is provided a SOC (State Of Charge) estimating apparatus, comprising: a measuring unit configured to measure at least one of voltage, current and temperature of a battery; a noise generating unit configured to generate noise corresponding to the voltage of the battery based on a plurality of preset voltage regions; a filtering unit configured to receive the noise generated by the noise generating unit and filter the generated noise to correspond to the voltage of the battery based on the plurality of preset voltage regions; and a SOC estimating unit configured to estimate a SOC of the battery based on at least one of voltage, current and temperature of the battery and the noise filtered by the filtering unit.

The plurality of preset voltage regions may be set as a noise generation region that is smaller than a first reference voltage, a hysteresis region that is equal to or greater than the first reference voltage and smaller than a second reference voltage, a filtering region that is equal to or greater than the second reference voltage and smaller than a third reference voltage, and a normal region that is equal to or greater than the third reference voltage.

The noise generating unit may be configured to generate noise having a predetermined magnitude, when the voltage of the battery belongs to the noise generation region.

The noise generating unit may be configured to maintain the magnitude of the generated noise as the predetermined magnitude, when the voltage of the battery increases so that the region to which the voltage of the battery belongs changes from the noise generation region to the hysteresis region.

The noise generating unit may be configured to maintain the magnitude of the generated noise as the predetermined magnitude, when the voltage of the battery increases so that the region to which the voltage of the battery belongs changes from the noise generation region to the filtering region through the hysteresis region.

The filtering unit may be configured to filter the noise by reducing the magnitude of the noise while the voltage of the battery is belonging to the filtering region, when the region to which the voltage of the battery belongs changes to the filtering region.

The filtering unit may be configured to lower a reduction ratio of the magnitude of the noise in at least a partial region, while the voltage of the battery is belonging to the filtering region.

A SOC estimating apparatus according to another aspect of the present disclosure may further comprise a region setting unit configured to set the plurality of voltage regions based on at least one of voltage, current, temperature and SOC of the battery.

The region setting unit may be configured to estimate a degradation degree of the battery based on at least one of voltage, current and SOC of the battery, compare the estimated degradation degree of the battery with a reference degradation degree, and change a magnitude of at least one of the hysteresis region and the filtering region.

The region setting unit may be configured to increase a magnitude of at least one of the hysteresis region and the filtering region in proportion to a difference between the estimated degradation degree of the battery and the reference degradation degree, when the estimated degradation degree of the battery is equal to or greater than the reference degradation degree.

The region setting unit may be configured to compare the temperature of the battery with a reference temperature and change a magnitude of at least one of the hysteresis region and the filtering region.

The region setting unit may be configured to increase a magnitude of at least one of the hysteresis region and the filtering region in proportion to a difference between the temperature of the battery and the reference temperature, when the temperature of the battery is equal to or higher than the reference temperature.

A battery pack according to still another aspect of the present disclosure may comprise the SOC estimating apparatus according to the present disclosure.

A SOC estimating method according to still another aspect of the present disclosure may comprise: a measuring step of measuring at least one of voltage, current and temperature of a battery; a noise generating step of generating noise corresponding to the voltage of the battery based on a plurality of preset voltage regions; a noise filtering step of filtering the noise generated in the noise generating step to correspond to the voltage of the battery based on the plurality of preset voltage regions; and a SOC estimating step of estimating a SOC of the battery based on at least one of voltage, current and temperature of the battery and the noise filtered in the noise filtering step.

Advantageous Effects

According to the present disclosure, the accuracy of the estimated SOC of the battery may be improved by noise generated and filtered to correspond to the voltage of the battery.

In addition, since noise is generated and filtered to correspond to the voltage of the battery, the fluctuation width of SOC error may be significantly reduced. Therefore, high accuracy of the estimated SOC of the battery may be maintained continuously.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In an embodiment described below, a battery refers to a secondary battery. Here, the secondary battery collectively refers to secondary batteries that cause an electrochemical reaction at a positive electrode and a negative electrode during charging and discharging. For example, the secondary battery may mean a lithium secondary battery in which lithium ion acts as a working ion.

Meanwhile, even though the name of the secondary battery is changed depending on the type of electrolyte or separator used in the lithium secondary battery, the type of packaging material used to package the secondary battery, or the structure of the interior or exterior of the lithium secondary battery, all secondary batteries in which lithium ions are used as working ions should be interpreted as being included in the category of lithium secondary batteries.

A secondary battery other than the lithium secondary battery may also be applied as the battery of the present disclosure. Therefore, even though the working ion is not a lithium ion, it should be interpreted that any secondary battery to which the technical idea of the present disclosure can be applied is included in the category of the present disclosure regardless of its type.

In addition, the battery is not limited by the number of elements included therein. Therefore, the battery should be interpreted as including a single cell including an assembly of a positive electrode, a separator and a negative electrode assembly and an electrolyte in a single package, an assembly of single cells, a module in which a plurality of assemblies are connected in series and/or in parallel, and a pack in which a plurality of modules are connected in series and/or in parallel, a battery system in which a plurality of packs are connected in series and/or in parallel, and the like.

Figure 1:
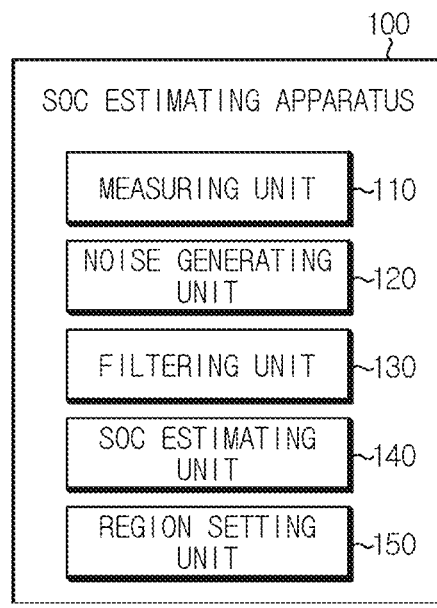
FIG. 1 is a diagram schematically showing a SOC estimating apparatus according to an embodiment of the present disclosure.

FIG. 1 is a diagram schematically showing a SOC estimating apparatus 100 according to an embodiment of the present disclosure. Also, FIG. 2 is a diagram schematically showing a battery pack 1 including the SOC estimating apparatus 100 according to an embodiment of the present disclosure.

Figure 2:
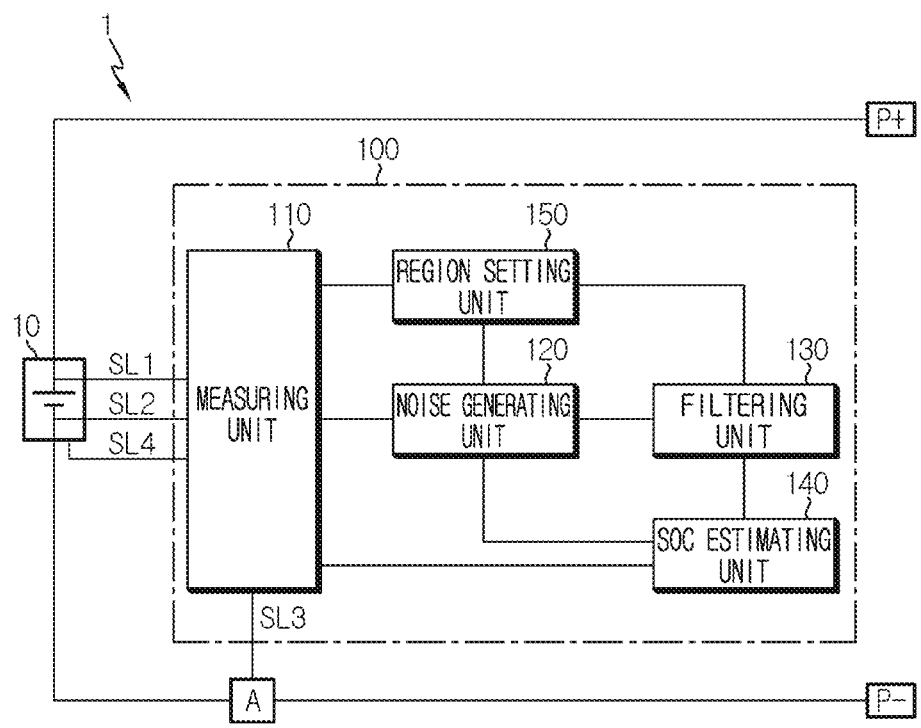
FIG. 2 is a diagram schematically showing a battery pack including the SOC estimating apparatus according to an embodiment of the present disclosure.

Referring to FIGS. 1 and 2, the SOC estimating apparatus 100 according to an embodiment of the present disclosure may include a measuring unit 110, a noise generating unit 120, a filtering unit 130, and a SOC estimating unit 140.

The measuring unit 110 may be configured to measure at least one of voltage, current and temperature of a battery 10.

The measuring unit 110 may measure a voltage of battery 10 through a sensing line. Specifically, the measuring unit 110 may measure the voltage of the battery 10 through a first sensing line SL1 and a second sensing line SL2.

For example, in the embodiment of FIG. 2, the measuring unit 110 may measure a positive electrode voltage of the battery 10 through the first sensing line SL1 and measure a negative electrode voltage of the battery 10 through the second sensing line SL2. Also, the measuring unit 110 may measure the voltage of the battery 10 based on the positive electrode voltage and the negative electrode voltage of the battery 10.

In addition, the measuring unit 110 may be connected to a current sensing unit A provided on a charging and discharging path of the battery 10 to measure a current of the battery 10. Here, it should be noted that the current of the battery 10 commonly refers to a discharging current output from the battery 10 and a charging current flowing into the battery 10.

Specifically, the measuring unit 110 may be connected to the current sensing unit A through a third sensing line SL3 to measure the current of the battery 10 flowing in the charging and discharging path by means of the current sensing unit A.

Here, the charging and discharging path means a high current path of the battery 10. For example, in the embodiment of FIG. 2, a positive electrode terminal of the battery 10 and a positive electrode terminal (P+) of the battery pack 1 may be connected to each other, and a negative electrode terminal of the battery 10 and a negative electrode terminal (P−) of the battery pack 1 may be connected to each other. Also, a path through which the positive electrode terminal (P+) of the battery pack 1, the battery 10 and the negative electrode terminal (P−) of the battery pack 1 are connected may be the charging and discharging path of the battery 10, namely the high current path. In the embodiment of FIG. 2, an example where the current sensing unit A is provided between the negative electrode terminal of the battery 10 and the negative electrode terminal (P−) of the battery pack 1 is illustrated, but the current sensing unit A may also be provided between the positive electrode terminal of the battery 10 and the positive electrode terminal (P+) of the battery pack 1.

In addition, the measuring unit 110 may measure a temperature of the battery 10 through a sensing line. Specifically, the measuring unit 110 may include a temperature sensor and measure the temperature of the battery 10 through the heat of the battery 10 conducted through the sensing line.

For example, in the embodiment of FIG. 2, the measuring unit 110 may be connected to the battery 10 through a fourth sensing line SL4 to measure the temperature of the battery 10. Preferably, the fourth sensing line SL4 may be made of a material that easily conducts heat.

The noise generating unit 120 may be configured to generate noise corresponding to the voltage of the battery 10 based on a plurality of preset voltage regions.

Specifically, the noise generated by the noise generating unit 120 may correspond to process noise that may be used when the SOC estimating unit 140 estimates a SOC of the battery 10. That is, the noise generating unit 120 may generate process noise by comparing the plurality of preset voltage regions with the voltage of the battery 10 measured by the measuring unit 110.

For example, the plurality of voltage regions may be set in advance as a noise generation region that is smaller than a first reference voltage, a hysteresis region that is equal to or greater than the first reference voltage and smaller than a second reference voltage, a filtering region that is equal to or greater than the second reference voltage and smaller than a third reference voltage, and a normal region that is equal to or greater than the third reference voltage. Here, among the first reference voltage, the second reference voltage and the third reference voltage, the magnitude of the first reference voltage may be smallest, and the magnitude of the third reference voltage may be greatest.

Figure 3:
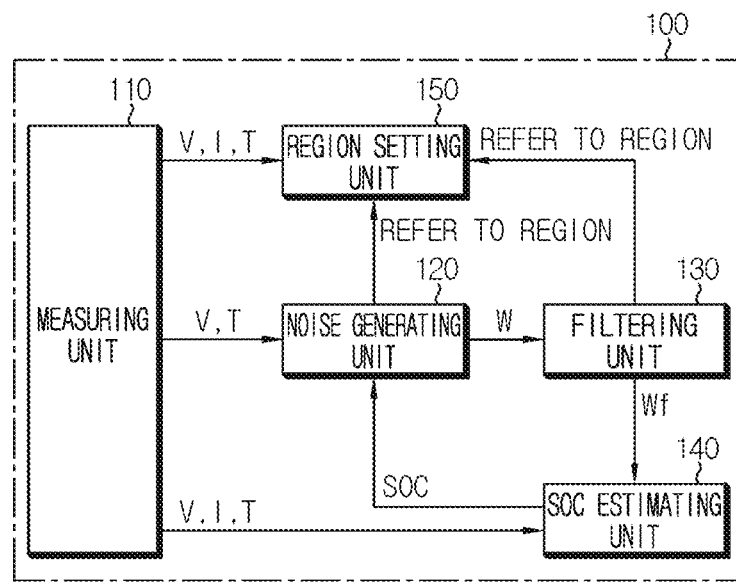
FIG. 3 is a diagram schematically showing a data flow of the SOC estimating apparatus according to an embodiment of the present disclosure.

FIG. 3 is a diagram schematically showing a data flow of the SOC estimating apparatus 100 according to an embodiment of the present disclosure.

In the embodiment of FIG. 3, the noise generating unit 120 may be communicatively connected to the measuring unit 110. Also, the noise generating unit 120 may receive the voltage of the battery 10 from the measuring unit 110 and determine a preset voltage region to which the voltage of the battery 10 belongs, among the plurality of preset voltage regions.

In addition, the noise generating unit 120 may determine the region in which the voltage of the battery 10 belongs to among the noise generation region, the hysteresis region, the filtering region and the normal region, and generate noise corresponding to the region to which the voltage of the battery 10 belongs.

The filtering unit 130 may be configured to receive the noise (W) generated by the noise generating unit 120.

For example, in the embodiment of FIG. 2, the noise generating unit 120 and the filtering unit 130 may be connected to each other. Also, the noise (W) generated by the noise generating unit 120 may be transmitted to the filtering unit 130.

More specifically, in the embodiment of FIG. 3, the noise generating unit 120 and the filtering unit 130 may be communicatively connected to each other. Also, the filtering unit 130 may receive the noise (W) from the noise generating unit 120.

The filtering unit 130 may be configured to filter the generated noise (W) to correspond to the voltage of the battery 10 based on the plurality of preset voltage regions.

For example, when receiving the noise (W) from the noise generating unit 120, the filtering unit 130 may receive a voltage (V) of the battery 10 together. Also, the filtering unit 130 may determine the region in which the voltage (V) of the battery 10 received from the noise generating unit 120 belongs to among the plurality of preset voltage regions.

In another embodiment, when receiving the noise (W) from the noise generating unit 120, the filtering unit 130 may receive information about the region to which the voltage (V) of the battery 10 belongs to among the plurality of preset voltage regions.

In still another embodiment, the measuring unit 110 may transmit the measured voltage of the battery 10 to the noise generating unit 120 and the filtering unit 130. Also, the filtering unit 130 may determine the region in which the voltage (V) of the battery 10 received from the measuring unit 110 belongs to among the plurality of preset voltage regions.

After that, the filtering unit 130 may change a magnitude of the noise (W) by filtering the noise (W) received from the noise generating unit 120 to correspond to the region to which the voltage (V) of the battery 10 belongs among the plurality of preset voltage regions.

The SOC estimating unit 140 may be configured to estimate a state of charge (SOC) of the battery 10 based on at least one of voltage (V), current (I) and temperature (T) of the battery 10 and the noise (Wf) filtered by the filtering unit 130.

For example, the SOC estimating unit 140 may employ a Kalman filter configured to estimate the SOC of the battery 10 by using an equivalent circuit model designed to simulate linear operating characteristics of the battery 10. Preferably, the SOC estimating unit 140 may employ an extended Kalman filter. It should be noted that the Kalman filter or the extended Kalman filter is a commonly used technique for estimating the SOC of the battery 10 and thus its detailed description is omitted below.

In the embodiment of FIG. 3, the SOC estimating unit 140 may receive the voltage (V) of the battery 10, the current (I) of the battery 10, and the temperature (T) of the battery 10 from the measuring unit 110. In addition, the SOC estimating unit 140 may further receive the filtered noise (Wf) from the filtering unit 130. After that, the SOC estimating unit 140 may estimate the SOC of the battery 10 using at least one of the received voltage (V), current (I) and temperature (T) of the battery 10 and the filtered noise (Wf).

In this process, the equivalent circuit model used in the SOC estimating unit 140 may well simulate an actual polarization voltage of the battery 10 while the battery 10 is in a linear operating state. That is, while the battery 10 is in a linear operation state, the SOC of the battery 10 may be estimated accurately using the equivalent circuit model.

However, while the battery 10 is in a non-linear operation state, the difference between the polarization voltage calculated using the equivalent circuit model and the actual polarization voltage of the battery 10 may exceed an allowable range. This may lower the accuracy of the SOC estimated by the SOC estimating unit 140.

Thus, the noise (Wf) filtered by the filtering unit 130 is the process noise used in the SOC estimating unit 140, and may be regarded as a parameter used to improve the accuracy in estimating the SOC of the battery 10.

The SOC estimating apparatus 100 according to an embodiment of the present disclosure may generate and filter the noise (W) to correspond to a region to which the measured voltage (V) of the battery 10 belongs among the plurality of preset voltage regions. Thus, even though the battery 10 is in a non-linear operation state, the accuracy in estimating the SOC of the battery 10 may be improved since the filtering noise (Wf) is used in the process of estimating the SOC of the battery 10.

Hereinafter, an embodiment and a comparative example of the noise generated and filtered to correspond to a region to which the voltage of the battery 10 belongs among the plurality of voltage regions will be described in detail with reference to FIG. 4.

Figure 4:
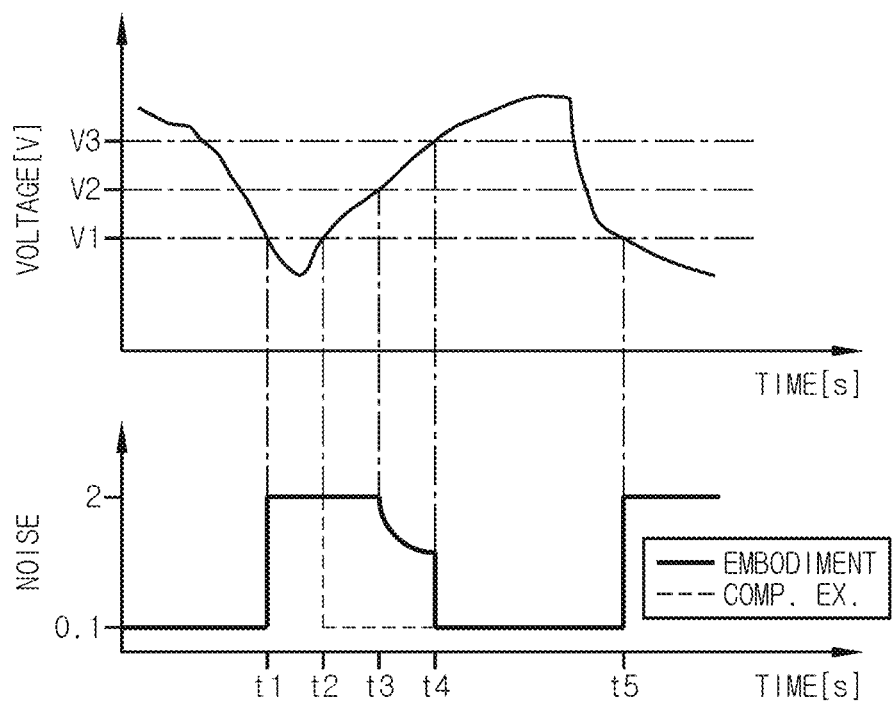
FIG. 4 is a diagram exemplarily showing an embodiment and a comparative example of noise filtered by the SOC estimating apparatus according to an embodiment of the present disclosure.

FIG. 4 is a diagram exemplarily showing an embodiment and a comparative example of noise filtered by the SOC estimating apparatus 100 according to an embodiment of the present disclosure.

Here, in the embodiment of the filtered noise, noise is generated and filtered by comparing the voltage of the battery 10 with the plurality of voltage regions divided by the first voltage, the second voltage and the third voltage. That is, in the embodiment of FIG. 4, noise filtered by the noise generating unit 120 and the filtering unit 130 is illustrated.

In addition, in the comparative example, noise is generated by comparing the voltage of the battery 10 with two voltage regions divided based only on the first voltage. That is, in the comparative example of FIG. 4, noise generated by the noise generating unit 120 and not subjected to a separate filtering process is illustrated.

In the embodiment FIG. 4, the first voltage is V1 [V], the second voltage is V2 [V], and the third voltage is V3 [V]. That is, a voltage region smaller than V1 [V] may be the noise generation region, a voltage region equal to or greater than V1 [V] and smaller than V2 [V] may be the hysteresis region, and a voltage region equal to or greater than V2 [V] and smaller than V3 [V] may be the filtering region. Also, a voltage region equal to or greater than V3 [V] may be the normal region.

Meanwhile, in the comparative example, the voltage region smaller than V1 [V] may correspond to the noise generation region of the embodiment, and the voltage region equal to or greater than V1 [V] may correspond to the normal region of the embodiment.

In the embodiment and the comparative example of FIG. 4, the noise may be generated to have a magnitude of 0.1 or 2 depending on the voltage region to which the voltage of the battery 10 belongs. However, the magnitude of the noise shown in FIG. 4 is a magnitude set for convenient explanation, and it should be noted that the magnitude of the noise is not limited to the magnitude shown in FIG. 4.

In another embodiment, the noise generating unit 120 may generate noise having a predetermined magnitude (for example, 2) according to the voltage region to which the voltage of the battery 10 belongs, or may not.

However, hereinafter, it is assumed that noise having a magnitude of 0.1 or 2 is generated by the noise generating unit 120, as shown in FIG. 4.

<Region Before a Time Point t1>

In the embodiment of FIG. 4, before a time point t1, the noise generating unit 120 may generate noise having a magnitude of 0.1. For example, in the embodiment of FIG. 3, the noise generating unit 120 may receive the voltage of the battery 10 and the temperature of the battery 10 from the measuring unit 110 and generate noise having a magnitude of 0.1 by putting the voltage of the battery 10 and the temperature of the battery 10 in a preset noise generation table. Specifically, in a process in which the voltage of the battery 10 is reduced toward the noise generation region, the noise generating unit 120 may generate noise having a magnitude of 0.1.

In addition, in the comparative example, noise having a magnitude of 0.1 may also be generated before the time point t1.

<Region of the Time Point t1 to a Time Point t2>

The noise generating unit 120 may be configured to generate noise having a predetermined magnitude, if the voltage of the battery 10 belongs to the noise generation region.

For example, in the embodiment of FIG. 4, it is assumed that the voltage of the battery 10 belongs to a voltage region smaller than V1 [V] at the time point t1. The noise generating unit 120 may immediately generate noise having a magnitude of 2 at the time point t1.

In addition, in the comparative example, since the voltage of the battery 10 belongs to the voltage region smaller than V1 [V] at the time point t1, noise having a magnitude of 2 may be generated.

<Region of the Time Point t2 to a Time Point t3>

The noise generating unit 120 is configured to maintain the magnitude of the generated noise as the predetermined magnitude, if the voltage of the battery 10 increases so that the region to which the voltage of the battery 10 belongs is changed from the noise generation region to the hysteresis region.

For example, in the embodiment of FIG. 4, it is assumed that the voltage of the battery 10 belongs to the voltage region equal to or greater than V1 [V] at the time point t2. That is, the voltage of the battery 10 at the time point t2 may be changed to belong to the hysteresis region. The noise generating unit 120 may maintain the magnitude of the noise generated at the time point t1 even between the time point t2 and the time point t3. That is, the noise generating unit 120 may generate noise having the magnitude generated in the noise generation region even while the voltage of the battery 10 belongs to the hysteresis region.

Meanwhile, in the comparative example, noise having a magnitude of 0.1 may be generated from the time point t2. Specifically, in the comparative example, since the plurality of voltage regions are divided into two regions based on the first voltage V1 [V], if the voltage of the battery 10, which has been smaller than V1 [V], is increased to V1 [V] or above, the magnitude of the generated noise may be changed.

That is, from the time point t2, in the embodiment according to the present disclosure, noise having a magnitude of 2 is generated by the noise generating unit 120, but in the comparative example, noise having a magnitude of 0.1 may be generated.

<Region of the Time Point t3 to a Time Point t4>

The noise generating unit 120 may be configured to maintain the magnitude of the generated noise as the predetermined magnitude, if the voltage of the battery 10 increases so that the region to which the voltage of the battery 10 belongs is changed from the noise generation region to the filtering region through the hysteresis region.

For example, in the embodiment of FIG. 4, it is assumed that the voltage of the battery 10 belongs to a voltage region equal to or greater than V2 [V] at the time point t3. That is, the voltage of the battery 10 at time point t3 may be changed to belong to the filtering region. The noise generating unit 120 may maintain the magnitude of the noise generated at the time point t1 even between the time point t3 and the time point t4. That is, the noise generating unit 120 may generate noise having the magnitude generated in the noise generation region even while the voltage of the battery 10 belongs to the filtering region.

In addition, the filtering unit 130 may be configured to filter the noise by reducing the magnitude of the noise while the voltage of the battery 10 is belonging to the filtering region, if the region to which the voltage of the battery 10 belongs is changed to the filtering region.

That is, while the voltage of the battery 10 belongs to the filtering region, the magnitude of the noise generated by the noise generating unit 120 is 2, but the magnitude of the noise may be filtered and reduced by the filtering unit 130.

Meanwhile, in the comparative example, noise having a magnitude of 0.1 may be continuously generated from the time point t2.

<Region of the Time Point t4 to a Time Point t5>

In addition, the noise generating unit 120 may generate noise based on the noise generation table, if the voltage of the battery 10 increases so that the region to which the voltage of the battery 10 belongs is changed from the noise generation region to the normal region through the hysteresis region and the filtering region. That is, in the embodiment of FIG. 4, the noise generating unit 120 may generate noise having a magnitude of 0.1 based on the noise generation table.

Also, as in the region before the time point t1, in the process in which the voltage of the battery 10 is lowered toward the noise generation region, the noise generating unit 120 may generate noise having a magnitude of 0.1.

That is, from the time point t4, noise having a magnitude of 0.1 may be generated in both the embodiment and the comparative example.

<Region After the Time Point t5>

For example, in the embodiment of FIG. 4, it is assumed that the voltage of the battery 10 belongs to a voltage region smaller than V1 [V] at the time point t5, similar to the time point t1. The noise generating unit 120 may immediately generate noise having a magnitude of 2 at the time point t5.

Also, in the comparative example, since the voltage of the battery 10 at the time point t5 belongs to the voltage region smaller than V1 [V], noise having a magnitude of 2 may be generated.

In summary, in the embodiment, the magnitude of the noise generated when the voltage of the battery 10 belongs to the hysteresis region may be the same as the magnitude of the noise generated when the voltage of the battery 10 belongs to the noise generation region. Meanwhile, in the comparative example, the magnitude of the noise may be equal to the magnitude of the noise generated when the voltage of the battery 10 does not belong to the noise generation region.

In addition, in the embodiment, the magnitude of the noise generated when the voltage of the battery 10 belongs to the filtering region may be equal to the magnitude of the noise generated when the voltage of the battery 10 belongs to the noise generation region. In addition, the magnitude of the noise generated by the filtering unit 130 may be filtered and reduced. Meanwhile, in the comparative example, the magnitude of the noise may be equal to the magnitude of the noise generated when the voltage of the battery 10 does not belong to the noise generation region.

Due to the difference between the magnitude of noise generated and filtered in the embodiment and the magnitude of noise generated in the comparative example, an error of the SOC estimated based on the noise is significantly different between the embodiment and the comparative example, as will be described later in detail.

Figure 5:
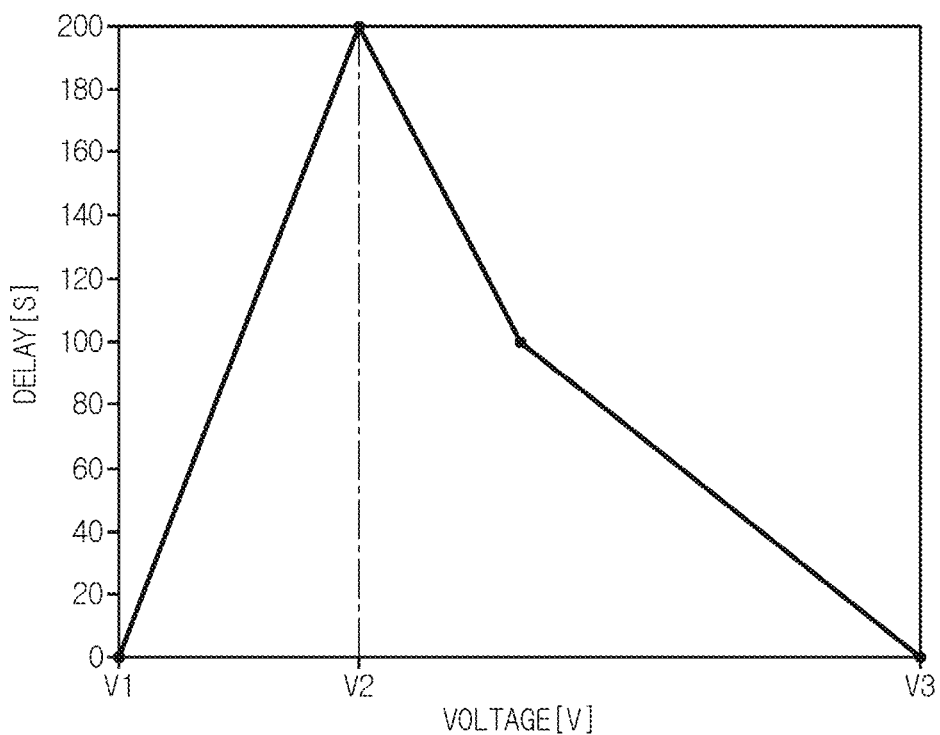
FIG. 5 is a diagram schematically showing an example of time delayed by the SOC estimating apparatus according to an embodiment of the present disclosure.

FIG. 5 is a diagram schematically showing an example of time delayed by the SOC estimating apparatus 100 according to an embodiment of the present disclosure.

Specifically, FIG. 5 is a diagram showing a delay required while the voltage of the battery 10 belongs to the hysteresis region and the filtering region.

In the embodiment of FIG. 5, a voltage region equal to and greater than V1 [V] and smaller than V2 [V] is the hysteresis region, and a voltage region equal to and greater than V2 [V] and smaller than V3 [V] is the filtering region.

Also, at a time point when the voltage of the battery 10 becomes V3 [V], the voltage of the battery 10 may belong to the normal region.

First, the delay in FIG. 5 may be a time delay required until the magnitude of the noise generated by the noise generating unit 120 and filtered by the filtering unit 130 becomes equal to the magnitude of the noise generated when the voltage of the battery 10 belongs to the normal region, while the voltage of the battery 10 belongs to the hysteresis region and the filtering region.

According to an embodiment of the present disclosure, if the voltage of the battery 10 belongs to the hysteresis region, the noise generated by the noise generating unit 120 is not filtered by the filtering unit 130, and thus the time delay may be gradually increased.

In addition, if the voltage of the battery 10 belongs to the filtering region, the noise generated by the noise generating unit 120 is filtered by the filtering unit 130, and thus the time delay may be gradually reduced.

However, the sum of the time delays while the voltage of the battery 10 belongs to the hysteresis region and the filtering region may increase as the voltage of the battery 10 increases.

Preferably, while the voltage of the battery 10 belongs to the filtering region, the filtering unit 130 may be configured to lower a reduction ratio of the magnitude of the noise in at least partial region.

Specifically, the filtering unit 130 may lower the reduction ratio of the magnitude of the noise so that the magnitude of the noise generated by the noise generating unit 120 is gradually reduced, while the voltage of the battery 10 belongs to the filtering region.

For example, the filtering unit 130 may exponentially reduce the magnitude of the noise, while the voltage of the battery 10 belongs to the filtering region.

In the embodiment of FIG. 4, at the time point t3 to the time point t4 where the voltage of the battery 10 belongs to the filtering region, the filtering unit 130 may gradually reduce the reduction ratio of the magnitude of the noise over time. Therefore, during the time point t3 to the time point t4, the magnitude of the noise may be reduced not sharply but gently.

Thus, the SOC estimating apparatus 100 according to an embodiment of the present disclosure may prevent the magnitude of the noise from rapidly changing according to the voltage of the battery 10 by using the hysteresis region in which the magnitude of the noise is maintained and the filtering region in which the magnitude of the noise is gently reduced. As a result, since the sudden change in the magnitude of the noise is prevented, the accuracy of the SOC of the battery 10 estimated by the SOC estimating apparatus 100 is improved, and the fluctuation width of the error rate of the estimated SOC of the battery 10 may be reduced.

Hereinafter, the error of the SOC estimated in the embodiment and the comparative example will be comparatively explained with reference to FIG. 6.

Figure 6:
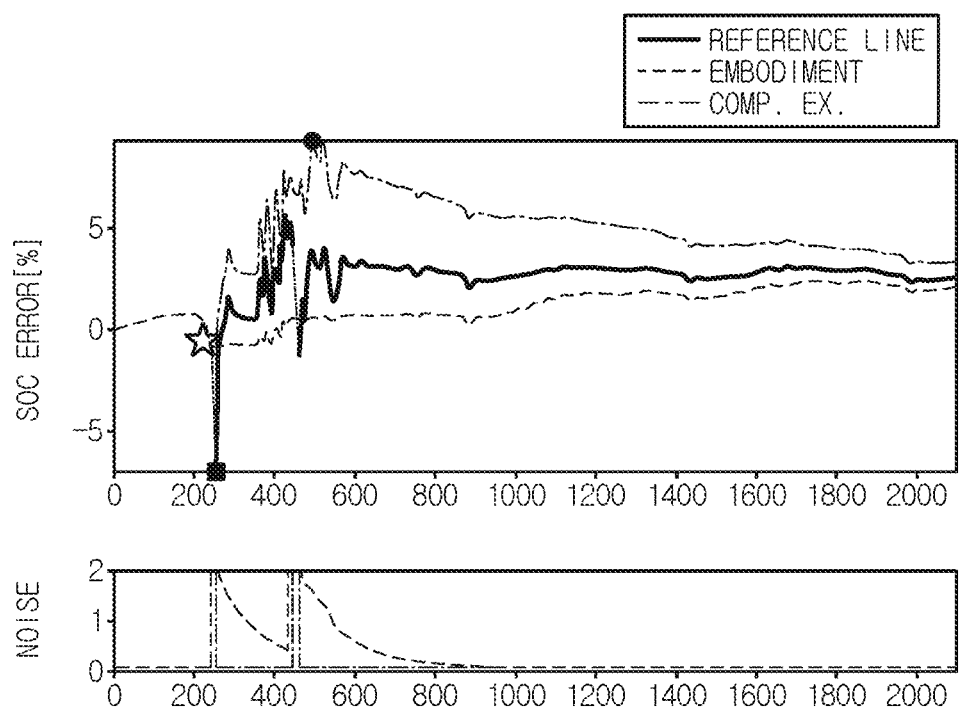
FIG. 6 is a diagram comparatively showing an error of the SOC estimated by the SOC estimating apparatus according to an embodiment of the present disclosure and an error of the SOC estimated by the comparative example.

FIG. 6 is a diagram comparatively showing an error of the SOC estimated by the SOC estimating apparatus 100 according to an embodiment of the present disclosure and an error of the SOC estimated by the comparative example.

In FIG. 6, a reference line shows a SOC error for the battery 10 estimated based on noise generated based only on the preset noise generation table and the temperature of the battery 10, without considering the voltage of the battery 10, unlike the embodiment and the comparative example.

In addition, in the embodiment, a SOC error for the battery 10 estimated based on the noise generated by the noise generating unit 120 and filtered by the filtering unit 130 is shown, like the embodiment of FIG. 4.

Also, in the comparative example, a SOC error for the battery 10 estimated based on the noise generated based on one reference voltage is shown, like the comparative example in FIG. 4.

Specifically, in FIG. 6, the mark "☆" indicates a time point where the voltage of the battery 10 belongs to the noise generation region, the mark "■" indicates a time point where the voltage of the battery 10 belongs to the hysteresis region, and the mark "●" indicates a time point where the difference between the SOC estimated according to the embodiment and the SOC estimated according to the comparative example is greatest.

That is, the time point indicated by the mark "☆" may correspond to the time point t1 of FIG. 4, and the time point indicated by the mark "■" may correspond to the time point t2 of FIG. 4.

As in the comparative example of FIG. 6, if the magnitude of noise is rapidly decreased at a time point where the voltage of the battery 10 deviates from the noise generation region (the time point indicated by the mark "■"), the error of the estimated SOC of the battery 10 may increase compared to the embodiment.

That is, the extended Kalman filter applied to the SOC estimating unit 140 is a probability statistical technique for estimating the state of the equivalent circuit model using measurable parameters. Therefore, if the magnitude of noise suddenly decreases because the voltage of the battery 10 deviates from the noise generation region, as shown in FIG. 6, an absolute value of the error of the SOC of the battery 10 estimated at the time point indicated by "■" may rapidly increase.

In addition, if the magnitude of noise increases and decreases repeatedly as in the comparative example, the SOC error may be changed over a greater width compared to the embodiment and the reference line. That is, in the probability statistical technique such as the extended Kalman filter, if the magnitude of process noise is repeatedly increased and decreased, the fluctuation width of the SOC error may be increased. Seeing the comparative example shown in FIG. 6, it may be found that the error of the estimated SOC of the battery 10 is about −8 [%] to +9 [%].

Meanwhile, seeing the embodiment shown in FIG. 6, the error of the estimated SOC of the battery 10 is about ±2 [%], and it may be found that the accuracy of the SOC estimated according to the embodiment is more accurate than that of the comparative example and the reference line and the fluctuation width of the SOC error is also the lowest.

That is, the SOC estimating apparatus 100 according to an embodiment of the present disclosure may improve the accuracy of the estimated SOC for the battery 10 by setting the hysteresis region where the magnitude of the noise is maintained and the filtering region where the magnitude of the noise is gently reduced. In addition, since the fluctuation width of the SOC error of the battery 10 estimated by the SOC estimating apparatus 100 is low, the SOC of the battery 10 may be continuously estimated with high accuracy.

A region setting unit 150 for setting the plurality of voltage regions based on at least one of voltage, current, temperature and SOC of the battery 10 may be further included.

Referring to FIG. 1, the SOC estimating apparatus 100 according to an embodiment of the present disclosure may further include the region setting unit 150.

For example, in the embodiment of FIG. 3, the region setting unit 150 may receive voltage, current and temperature of the battery 10 from the measuring unit 110. Also, the region setting unit 150 may refer to the SOC estimated by the SOC estimating unit 140.

In addition, the region setting unit 150 may change the magnitude of at least one of the noise generation region, the hysteresis region and the filtering region based on at least one of voltage, current, temperature and SOC of the battery 10.

Meanwhile, referring to FIG. 3, the SOC estimated by the SOC estimating unit 140 may be transmitted to the noise generating unit 120.

The noise generating unit 120 may generate noise using the preset noise table when the voltage of the battery 10 is reduced toward the noise generating unit 120 and belongs to the normal region. For example, in the embodiment of FIG. 4, in the region before the time point t1 and in the region from the time point t4 to the time point t5, the noise generating unit 120 may generate noise using the noise table and the temperature of the battery 10.

Here, the noise table is a table in which corresponding noise is set in advance based on the temperature of the battery 10 and the SOC of the battery 10.

Accordingly, the noise generating unit 120 may be configured to update the noise table using the SOC received from the SOC estimating unit 140. Therefore, for example, even if the voltage of the battery 10 belongs to the normal region, noise corresponding to the SOC of the battery 10 is generated, so that the SOC of the battery 10 may be more accurately estimated in a later step.

First, an embodiment in which the region setting unit 150 changes the magnitudes of the plurality of voltage regions based on a degradation degree of the battery 10 will be described.

The region setting unit 150 may be configured to estimate the degradation degree of the battery 10 based on at least one of voltage, current and SOC of the battery 10.

For example, the region setting unit 150 may calculate an internal resistance of the battery 10 using the voltage, current and SOC of the battery 10, and estimate the degradation degree of the battery 10 by comparing the calculated internal resistance with a reference resistance.

However, it should be noted that the method for the region setting unit 150 to estimate the degradation degree of the battery 10 by using at least one of the voltage, current and SOC of the battery 10 is not limited to the method using the internal resistance described above.

The region setting unit 150 may be configured to change the magnitude of at least one of the hysteresis region and the filtering region by comparing the estimated degradation degree of the battery 10 with a reference degradation degree.

The extended Kalman filter, which may be applied to the SOC estimating unit 140, may gradually decrease in accuracy as the battery 10 degrades. For example, the equivalent circuit model used in the extended Kalman filter includes parameters related to capacity and resistance of the battery 10, and it is difficult to properly update the parameters of the equivalent circuit model due to a decrease in capacity and an increase in resistance caused by degradation of the battery 10.

The region setting unit 150 may adjust the magnitude of the noise generated by the noise generating unit 120 and filtered by the filtering unit 130 by changing the magnitudes of the hysteresis region and the filtering region based on the degradation degree of the battery 10. Due to this, the noise filtered by the filtering unit 130 may be used as process noise considering the degradation degree of the battery 10 while the SOC estimating unit 140 estimates the SOC of the battery 10.

Accordingly, the SOC estimating apparatus 100 according to an embodiment of the present disclosure may more accurately estimate the SOC of the battery 10 by using the process noise considering the degradation degree of the battery 10.

Preferably, the region setting unit 150 may be configured to increase the magnitude of at least one of the hysteresis region and the filtering region in proportion to the difference between the estimated degradation degree of the battery 10 and the reference degradation degree, if the estimated degradation degree of the battery 10 is greater than or equal to the reference degradation degree.

For example, the region setting unit 150 may increase both the magnitude of the hysteresis region and the magnitude of the filtering region if the degradation degree of the battery 10 is greater than or equal to the reference degradation degree. In this case, in the embodiment of FIG. 4, both the magnitude of V2 [V] and the magnitude of V3 [V] may be increased. Therefore, the magnitude of the noise is maintained longer in the hysteresis region, and the noise may be more gently reduced for a longer period in the filtering region. That is, since the magnitude of the filtered noise input to the SOC estimating unit 140 is maintained above a certain magnitude (for example, the magnitude of 0.1 in FIG. 4), the accuracy of the SOC estimated in consideration of the degradation degree of the battery 10 may be improved.

Next, an embodiment in which the region setting unit 150 changes the magnitudes of the plurality of voltage regions based on the temperature of the battery 10 will be described.

The region setting unit 150 may be configured to change the magnitude of at least one of the hysteresis region and the filtering region by comparing the temperature of the battery 10 and a reference temperature.

Since the battery 10 is a secondary battery that induces an electrochemical reaction at a positive electrode and a negative electrode, there is a problem that nonlinear operation characteristics of the battery 10 may appear when the temperature of the battery 10 becomes higher than the reference temperature.

That is, since the equivalent circuit model used in the SOC estimating unit 140 is designed to simulate the linear operation characteristics of the battery 10, there is a problem that it is difficult to accurately simulate the nonlinear operation characteristics of the battery 10 caused by an increase in temperature of the battery 10.

Therefore, the region setting unit 150 may adjust the magnitude of the noise generated by the noise generating unit 120 and filtered by the filtering unit 130 by comparing the temperature of the battery 10 with the reference temperature and change the magnitude of at least one of the hysteresis region and the filtering region accordingly. Due to this, the noise filtered by the filtering unit 130 may be used as process noise in consideration of the nonlinear operation characteristics according to the temperature of the battery 10 while the SOC estimating unit 140 estimates the SOC of the battery 10.

The region setting unit 150 may be configured to increase the magnitude of at least one of the hysteresis region and the filtering region in proportion to the difference between the temperature of the battery 10 and the reference temperature, if the temperature of the battery 10 is higher than or equal to the reference temperature.

For example, the region setting unit 150 may increase both the magnitude of the hysteresis region and the magnitude of the filtering region if the temperature of the battery 10 is higher than or equal to the reference temperature.

That is, if the temperature of the battery 10 is higher than the reference temperature, the region setting unit 150 may increase the magnitudes of both the hysteresis region and the filtering region, as in the case where the degradation degree of the battery 10 is greater than or equal to the reference degradation degree.

Therefore, the magnitude of the noise may be maintained longer in the hysteresis region, and the noise may be more gently reduced for a longer period in the filtering region. In addition, the accuracy of the SOC estimated considering the temperature of the battery 10 by the SOC estimating unit 140 may be improved.

The SOC estimating apparatus 100 according to the present disclosure may be applied to a battery management system (BMS). That is, the BMS according to the present disclosure may include the SOC estimating apparatus 100 described above. In this configuration, at least some of the components of the SOC estimating apparatus 100 may be implemented by supplementing or adding functions of components included in a conventional BMS. For example, the measuring unit 110, the noise generating unit 120, the filtering unit 130, the SOC estimating unit 140 and the region setting unit 150 may be implemented as components of the BMS.

In addition, the SOC estimating apparatus 100 according to the present disclosure may be provided in a battery pack 1. For example, as in the embodiment of FIG. 2, the battery pack 1 according to the present disclosure may include the SOC estimating apparatus 100 described above and one or more batteries 10. In addition, the battery pack 1 may further include electrical components (relays, fuses, etc.) and a case.

Figure 7:
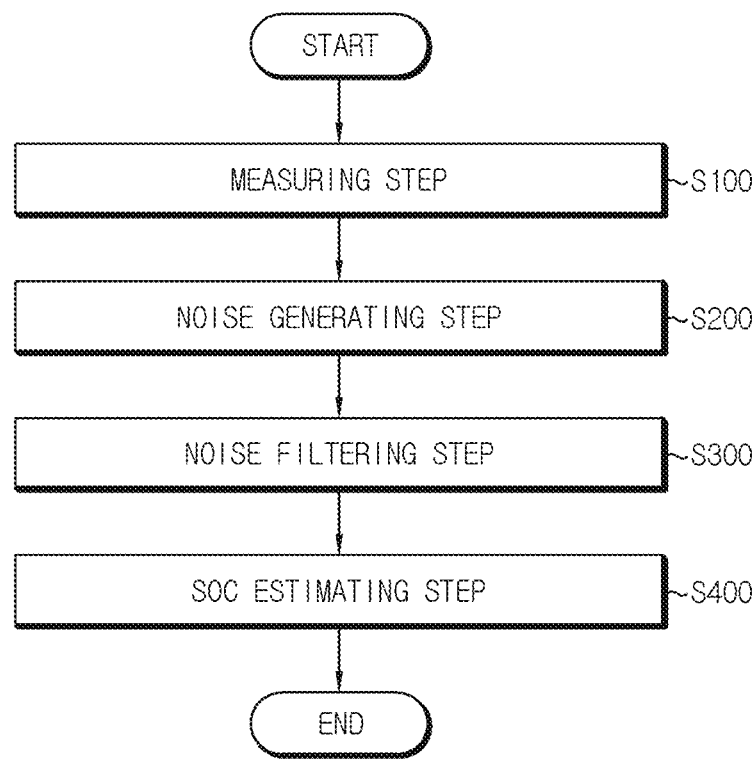
FIG. 7 is a diagram schematically showing a SOC estimating method according to another embodiment of the present disclosure.

FIG. 7 is a diagram schematically showing a SOC estimating method according to another embodiment of the present disclosure.

Here, the SOC estimating method according to another embodiment of the present disclosure may be executed by the SOC estimating apparatus 100 according to an embodiment of the present disclosure. Hereinafter, the content overlapping with the above description will be briefly described.

Referring to FIG. 7, the SOC estimating method according to another embodiment of the present disclosure may include a measuring step (S100), a noise generating step (S200), a noise filtering step (S300) and a SOC estimating step (S400).

The measuring step (S100) is a step of measuring at least one of voltage, current and temperature of the battery 10, and may be performed by the measuring unit 110.

Preferably, the measuring unit 110 may be configured to measure all of voltage, current and temperature of the battery 10 using a plurality of sensing units.

The noise generating step (S200) is a step of generating noise corresponding to the voltage of the battery 10 based on a plurality of preset voltage regions, and may be performed by the noise generating unit 120.

The noise generating unit 120 may generate noise having a predetermined magnitude if the voltage of the battery 10 received from the measuring unit 110 belongs to the noise generation region.

After that, if the voltage of the battery 10 increases so that the voltage region to which the voltage of the battery belongs is changed from the noise generation region to the hysteresis region, the noise generating unit 120 may maintain the magnitude of the noise as a predetermined magnitude.

In addition, even when the voltage of the battery 10 is further increased so that the voltage region to which the voltage of the battery 10 belongs is changed from the noise generation region to the filtering region through the hysteresis region, the noise generating unit 120 may maintain the magnitude of the noise at the predetermined magnitude.

The noise filtering step (S300) is a step of filtering the noise generated in the noise generating step (S200) to correspond to the voltage of the battery 10 based on the plurality of preset voltage regions, and may be performed by the filtering unit 130.

The filtering unit 130 may filter the magnitude of the noise generated by the noise generating unit 120 if the voltage of the battery 10 belongs to the filtering region through the noise generation region and the hysteresis region.

The SOC estimating step (S400) is a step of estimating a SOC of the battery 10 based on at least one of voltage, current and temperature of the battery 10 and the noise filtered in the noise filtering step (S300), and may be performed by the SOC estimating unit 140.

For example, an extended Kalman filter may be applied to the SOC estimating unit 140. Preferably, the SOC estimating unit 140 may estimate the SOC of the battery 10 by using the voltage, current and temperature of the battery 10 and the filtered noise as input parameters.

In describing various embodiments of the present disclosure, components named '~ unit' should be understood as functionally separated elements rather than physically separated elements. Thus, each component may be selectively integrated with other components, or each component may be divided into sub-components for efficient execution of control logic(s). However, it is obvious to those skilled in the art that even if the components are integrated or divided, as long as the functional identity thereof can be recognized, the integrated or divided components should be interpreted as being within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

1: battery pack
10: battery
100: SOC estimating apparatus
110: measuring unit
120: noise generating unit
130: filtering unit
140: SOC estimating unit
150: region setting unit

What is claimed is:

1. A state of charge (SOC) estimating apparatus, comprising:
   a measuring unit configured to measure at least one of: voltage, current, and temperature of a battery;
   a noise generating unit configured to generate noise corresponding to the voltage of the battery, based on a plurality of preset voltage regions;

a filtering unit configured to:
   receive the noise generated by the noise generating unit; and
   filter the generated noise to correspond to the voltage of the battery, based on the plurality of preset voltage regions; and
an SOC estimating unit configured to estimate an SOC of the battery, based on:
   at least one of: voltage, current and temperature of the battery, and
   the noise filtered by the filtering unit.

2. The SOC estimating apparatus according to claim 1, wherein the plurality of preset voltage regions are set as:
   a noise generation region that is smaller than a first reference voltage;
   a hysteresis region that is equal to or greater than the first reference voltage and smaller than a second reference voltage;
   a filtering region that is equal to or greater than the second reference voltage and smaller than a third reference voltage; and
   a normal region that is equal to or greater than the third reference voltage.

3. The SOC estimating apparatus according to claim 2, wherein the noise generating unit is further configured to generate noise having a predetermined magnitude, when the voltage of the battery belongs to the noise generation region.

4. The SOC estimating apparatus according to claim 3, wherein the noise generating unit is further configured to maintain the magnitude of the generated noise as the predetermined magnitude, when the voltage of the battery increases, so that the region to which the voltage of the battery belongs changes from the noise generation region to the hysteresis region.

5. The SOC estimating apparatus according to claim 3, wherein the noise generating unit is further configured to maintain the magnitude of the generated noise as the predetermined magnitude, when the voltage of the battery increases, so that the region to which the voltage of the battery belongs changes from the noise generation region to the filtering region through the hysteresis region.

6. The SOC estimating apparatus according to claim 5, wherein the filtering unit is further configured to filter the noise by reducing the magnitude of the noise while the voltage of the battery belongs to the filtering region, when the region to which the voltage of the battery belongs changes to the filtering region.

7. The SOC estimating apparatus according to claim 6, wherein the filtering unit is further configured to lower a reduction ratio of the magnitude of the noise in at least a partial region, while the voltage of the battery belongs to the filtering region.

8. The SOC estimating apparatus according to claim 2, further comprising a region setting unit configured to set the plurality of voltage regions, based on at least one of: voltage, current, temperature, and SOC of the battery.

9. The SOC estimating apparatus according to claim 8, wherein the region setting unit is further configured to:
   estimate a degradation degree of the battery, based on at least one of: voltage, current, and SOC of the battery;
   compare the estimated degradation degree of the battery with a reference degradation degree; and
   change a magnitude of at least one of: the hysteresis region and the filtering region.

10. The SOC estimating apparatus according to claim 9, wherein the region setting unit is further configured to increase a magnitude of at least one of: the hysteresis region and the filtering region in proportion to a difference between the estimated degradation degree of the battery and the reference degradation degree, when the estimated degradation degree of the battery is equal to or greater than the reference degradation degree.

11. The SOC estimating apparatus according to claim 8, wherein the region setting unit is further configured to:
   compare the temperature of the battery with a reference temperature, and
   change a magnitude of at least one of: the hysteresis region and the filtering region.

12. The SOC estimating apparatus according to claim 11, wherein the region setting unit is further configured to increase a magnitude of at least one of: the hysteresis region and the filtering region in proportion to a difference between the temperature of the battery and the reference temperature, when the temperature of the battery is equal to or higher than the reference temperature.

13. A battery pack, comprising the SOC estimating apparatus according to claim 1.

14. A state of charge (SOC) estimating method, comprising:
   a measuring operation of measuring at least one of: voltage, current, and temperature of a battery;
   a noise generating operation of generating noise corresponding to the voltage of the battery, based on a plurality of preset voltage regions;
   a noise filtering operation of filtering the noise generated in the noise generating operation to correspond to the voltage of the battery, based on the plurality of preset voltage regions; and
   an SOC estimating operation of estimating an SOC of the battery, based on:
      at least one of: voltage, current, and temperature of the battery; and
      the noise filtered in the noise filtering operation.

* * * * *